United States Patent
Yoo et al.

(10) Patent No.: US 12,308,870 B2
(45) Date of Patent: May 20, 2025

(54) ACLR ADJUSTABLE ELECTRONIC DEVICE AND OPERATION METHOD THEREFOR

(71) Applicant: SAMSUNG ELECTRONICS CO., LTD., Suwon-si (KR)

(72) Inventors: Kyungwoo Yoo, Suwon-si (KR); Hyung Sun Lim, Suwon-si (KR); Hongmin Choi, Suwon-si (KR); Joonhoi Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/218,367

(22) Filed: Jul. 5, 2023

(65) Prior Publication Data
US 2024/0080052 A1 Mar. 7, 2024

(30) Foreign Application Priority Data
Sep. 6, 2022 (KR) .................. 10-2022-0113068

(51) Int. Cl.
*H04B 1/04* (2006.01)

(52) U.S. Cl.
CPC ... *H04B 1/0475* (2013.01); *H04B 2001/0425* (2013.01)

(58) Field of Classification Search
CPC .................................. H04B 1/0475
USPC ...................................... 375/297
See application file for complete search history.

(56) References Cited

U.S. PATENT DOCUMENTS

| | | | |
|---|---|---|---|
| 8,354,884 B2 | 1/2013 | Braithwaite | |
| 8,576,941 B2 | 11/2013 | Bai et al. | |
| 8,787,494 B2 | 6/2014 | Bai | |
| 8,912,848 B2 | 12/2014 | Lee et al. | |
| 9,306,506 B1 | 4/2016 | Zhang et al. | |
| 9,337,781 B2 | 5/2016 | Hammi | |
| 9,659,120 B2 | 5/2017 | Fehri et al. | |
| 9,837,970 B2 | 12/2017 | Hammi et al. | |
| 10,630,323 B2 | 4/2020 | Spring et al. | |
| 2004/0212428 A1* | 10/2004 | Ode | H03F 1/3247 330/149 |

(Continued)

FOREIGN PATENT DOCUMENTS

| | | |
|---|---|---|
| KR | 10-2010-0110429 A | 10/2010 |
| KR | 10-2011-0121805 A | 11/2011 |

OTHER PUBLICATIONS

Extended European Search Report dated Feb. 15, 2024 in European Application No. 23182453.3.

(Continued)

*Primary Examiner* — Lihong Yu

(74) *Attorney, Agent, or Firm* — Sughrue Mion, PLLC

(57) ABSTRACT

Disclosed is an electronic device, which includes a predistorter that predistorts an input signal based on a predistortion coefficient to generate a predistortion signal; a power amplifier that amplifies the predistortion signal to generate an output signal; an error correction unit that updates the predistortion coefficient to minimize an Normalized Mean Square Error (NMSE) between the input signal and the output signal; and an ACLR adjustment unit that operates when the NMSE is minimized, calculates an Adjacent Channel Leakage Ratio (ACLR) from the output signal, and updates the predistortion coefficient to minimize a cost function defined based on the ACLR.

20 Claims, 10 Drawing Sheets

(56) References Cited

U.S. PATENT DOCUMENTS

| | | | |
|---|---|---|---|
| 2006/0012426 A1* | 1/2006 | Nezami | H03F 1/3247 |
| | | | 330/149 |
| 2010/0194474 A1* | 8/2010 | Ishikawa | H03F 3/24 |
| | | | 330/149 |
| 2011/0121897 A1 | 5/2011 | Braithwaite | |
| 2011/0170630 A1* | 7/2011 | Silverman | H04L 25/03343 |
| | | | 375/296 |
| 2012/0119811 A1 | 5/2012 | Bai et al. | |
| 2013/0200948 A1 | 8/2013 | Lee et al. | |
| 2013/0329833 A1 | 12/2013 | Bai | |
| 2014/0294119 A1 | 10/2014 | Sochacki | |
| 2015/0162881 A1 | 6/2015 | Hammi | |
| 2016/0065147 A1 | 3/2016 | Pratt et al. | |
| 2016/0079933 A1 | 3/2016 | Fehri et al. | |
| 2016/0261241 A1 | 9/2016 | Hammi et al. | |
| 2017/0317913 A1 | 11/2017 | Kim et al. | |
| 2019/0326942 A1* | 10/2019 | Spring | H04B 1/0458 |
| 2020/0382147 A1 | 12/2020 | Menkhoff et al. | |

OTHER PUBLICATIONS

Chen et al., "Data-driven Digital Pre-Distortion Design via Joint Intermediate and Radio Frequency Optimization", WS22 IEEE ICC 2022 the 4th International Workshop on Data Driven Intelligence for Networks and Systems, pp. 283-288 (6 pages total).

Chen et al., "Learning to Compensate: A Deep Neural Network Framework for 5G Power Amplifier Compensation", IEEE International Conference on Communications, 2021 (6 pages total).

\* cited by examiner

ACLR ADJUSTABLE ELECTRONIC DEVICE AND OPERATION METHOD THEREFOR

CROSS-REFERENCE TO RELATED APPLICATIONS

This application is based on claims priority under 35 U.S.C. § 119 to Korean Patent Application No. 10-2022-0113068, filed on Sep. 6, 2022, in the Korean Intellectual Property Office, the disclosures of which are incorporated by reference herein in their entireties.

BACKGROUND

1. Field

One or more aspect of the disclosure relates to an electronic device, and in particular, an Adjacent Channel Leakage Ratio (ACLR) adjustable electronic device and a method of operating the same.

2. Description of Related Art

Various wireless communication devices, such as smartphones, tablets, and Internet of Things (IoT) devices, include a power amplifier (PA) for amplifying power of a wireless signal. Since the power amplifier has a non-linear characteristic, a wireless signal passing through the power amplifier may cause interference in adjacent channels around a target channel. An Adjacent Channel Leakage Ratio (ACLR) is a parameter for measuring an amount of interference in the adjacent channels around the target channel, and an ACLR value is regulated such that the amount of interference does not exceed a specific value. For example, in the case of a 5G communication system, in Frequency Range 1 (FR 1), the ACLR value should be lesser than −31 dB Power Class 2 (PC2) or −30 dB (PC3).

To adjust the above-described ACLR, there is a digital pre-distortion (DPD) technique for compensating for nonlinearity of a power amplifier in the digital domain. The DPD technique can compensate for the nonlinearity of the power amplifier without increasing the voltage or current consumption of the power amplifier. However, related art DPD techniques are designed to minimize an Normalized Mean Square Error (NMSE) to compensate for nonlinearity. However, the related art DPD techniques do not consider minimization of the ACLR.

SUMMARY

One or more embodiments of the disclosure provide an electronic device capable of resolving a nonlinearity of a power amplifier by reducing or rebalancing an ACLR while minimizing an NMSE between an input signal and an output signal, and an operation method therefor.

According to an aspect of the disclosure, there is provided an electronic device including: a predistorter circuit configured to predistort an input signal based on a predistortion coefficient to generate a predistortion signal; a power amplifier configured to amplify the predistortion signal to generate an output signal; an error correction circuit configured to update the predistortion coefficient to minimize a Normalized Mean Square Error (NMSE) between the input signal and the output signal; and an Adjacent Channel Leakage Ratio (ACLR) adjustment circuit configured to operate based on a determination that the NMSE is minimized to: calculate an ACLR from the output signal of the power amplifier, and update the predistortion coefficient to minimize a cost function based on the ACLR.

The electronic device may further include a power amplifier modeling circuit configured to model the power amplifier as a function of the predistortion coefficient from the predistortion signal and the output signal.

The cost function may include a low ACLR corresponding to a low-band adjacent channel, a high ACLR corresponding to a high-band adjacent channel, and a weight of the cost function, based on a target channel of the output signal.

The ACLR adjustment circuit may configure the cost function to minimize a sum of the low ACLR and the high ACLR by setting the weight to be a first value, and configures the cost function to minimize a difference between the low ACLR and the high ACLR by setting the weight to be a second value smaller than the first value.

Based on the NMSE being minimized, the error correction circuit may be configured to be deactivated, and the ACLR adjustment circuit is configured to be activated.

The ACLR adjustment circuit, based on the predistortion coefficient being updated, may be configured to: compare the NMSE corresponding to a time k+1, which is an update time with an NMSE threshold value, k being a natural number, and compare a difference value between the predistortion coefficient corresponding to the k+1 time and the predistortion coefficient corresponding to a time k with a coefficient threshold value.

The ACLR adjustment circuit may be configured to stop updating the predistortion coefficient based on at least one of: the NMSE corresponding to the k+1 time being less than the NMSE threshold value, and the difference value being less than the coefficient threshold value.

According to another aspect of the disclosure, there is provided a method of operation performed by an electronic device, the method including: generating a predistortion signal by predistorting an input signal based on a predistortion coefficient; generating an output signal by amplifying the predistortion signal; updating the predistortion coefficient to minimize a Normalized Mean Square Error (NMSE) between the input signal and the output signal; and based on the NMSE being minimized, calculating an Adjacent Channel Leakage Ratio (ACLR) from the output signal and updating the predistortion coefficient to minimize a cost function based on the ACLR.

According to another aspect of the disclosure, there is provided an electronic device including: a transceiver; and a processor connected with the transceiver, and wherein the processor is configured to: generate a predistortion signal by predistorting an input signal based on a predistortion coefficient, update the predistortion coefficient to minimize a Normalized Mean Square Error (NMSE) between the input signal and an output signal of the transceiver; and based on the NMSE being minimized, calculate an Adjacent Channel Leakage Ratio (ACLR) from the output signal and update the predistortion coefficient to minimize a cost function based on the ACLR.

BRIEF DESCRIPTION OF DRAWINGS

A detailed description of each drawing is provided to facilitate a more thorough understanding of the drawings referenced in the detailed description of the disclosure.

DETAILED DESCRIPTION

Hereinafter, embodiments of the disclosure may be described in detail and clearly to such an extent that an ordinary one in the art easily implements the disclosure. As used herein, expressions such as "at least one of" when preceding a list of elements, modify the entire list of elements and do not modify the individual elements of the list. For example, the expression, "at least one of a, b, and c" should be understood as including only a, only b, only c, both a and b, both a and c, both b and c, or all of a, b, and c.

Figure 1:
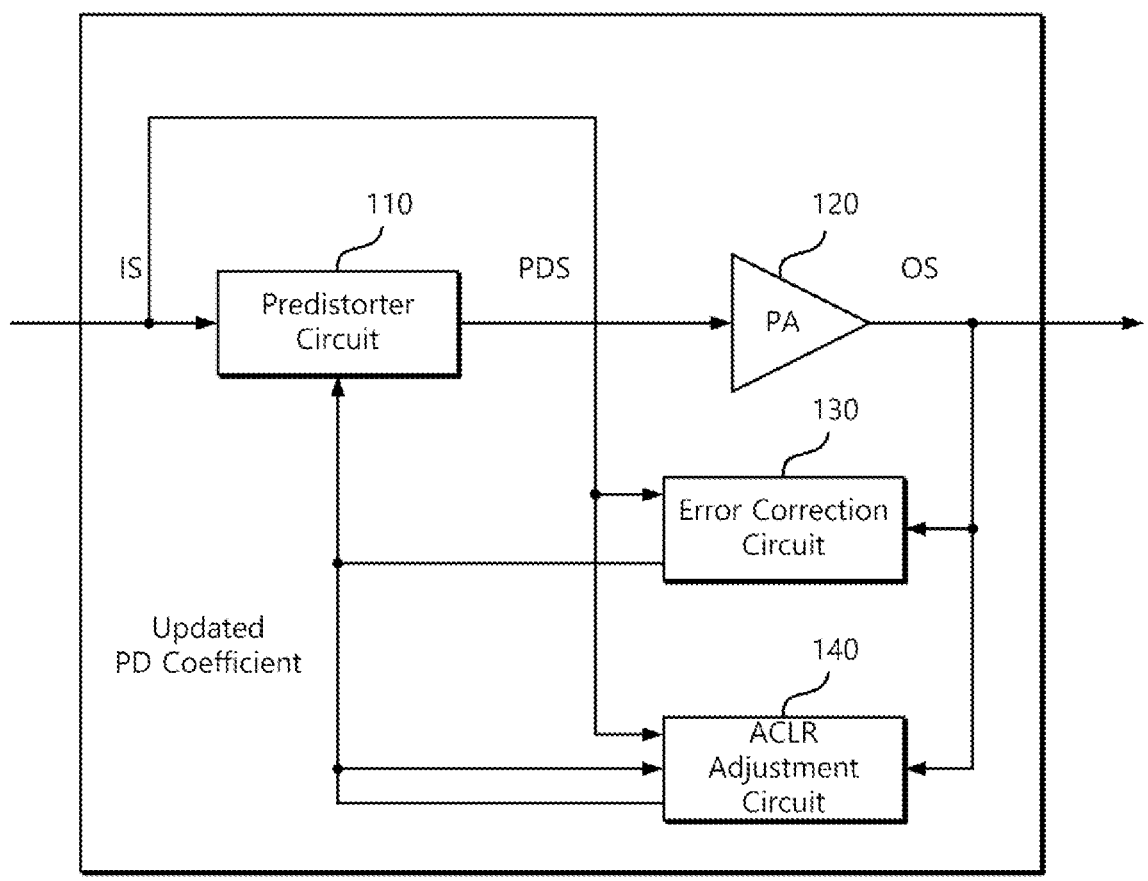
FIG. 1 is a diagram illustrating an electronic device according to an example embodiment of the disclosure.

FIG. 1 is a diagram illustrating an electronic device according to an example embodiment of the disclosure.

Referring to FIG. 1, an electronic device 100_1 according to an example embodiment includes a predistorter circuit 110, a power amplifier (PA) 120, an error correction circuit 130, and an Adjacent Channel Leakage Ratio (ACLR) adjustment circuit 140.

The predistorter circuit 110 is provided at an input end of the power amplifier 120, and performs a predistortion on an input signal IS based on the predistortion coefficient to generate a predistortion signal PDS. That is, the predistorter circuit 110 may distort the input signal IS based on a predistortion coefficient to generate the predistortion signal PDS. The predistortion operation of the predistorter circuit 110 may refer to a technique of predistorting the input signal IS depending on a nonlinearity opposite to a nonlinearity of the power amplifier 120. According to the predistortion, the nonlinearity of the power amplifier 120 may be compensated.

According to an example embodiment, the input signal IS of the predistorter circuit 110 may be a digital signal in a baseband, and thus it may be understood that the predistortion operation of the predistorter circuit 110 is performed in a digital domain. The input signal IS may be, for example, an original signal to be amplified by the power amplifier 120 or a desired output signal that is an output signal OS as a target signal. When the target signal is the input signal IS, the target signal will be similar to the power level of the output signal OS, so that a gain dividing block for normalization may be omitted at an output terminal of the power amplifier 120. Alternatively, when the input signal IS is an original signal, the gain dividing block for normalization may be added to the output terminal of the power amplifier 120. For example, the gain dividing block for normalization may be added to the output terminal of the power amplifier 120 in a feedback loop. The gain dividing block may perform an operation of dividing the output signal OS by a gain Go of the linearized power amplifier 120.

Hereinafter, a case in which the input signal IS is the target signal will be described for convenience, but example embodiments of the disclosure are not limited thereto.

The power amplifier 120 is connected to an output terminal of the predistorter circuit 110, and amplifies the power of the predistortion signal PDS that is an output signal of the predistorter circuit 110 to generate the output signal OS. Since the power amplifier 120 has a non-linear characteristic as described above, the output signal OS may be distorted when there is no non-linearity compensation operation such as a predistortion operation. In addition, when the output signal OS is distorted, interference may occur in an adjacent channel other than the target channel of the output signal OS. According to an example embodiment, the nonlinearity of the output signal OS may be resolved or adjusted by the above-described predistorter circuit 110, and the generated ACLR may be reduced or rebalanced by the ACLR adjustment circuit 140 to be described later.

According to an example embodiment, the error correction circuit 130 is provided in the feedback loop of the electronic device 100_1, and updates the predistortion coefficient to minimize the Normalized Mean Square Error (NMSE) between the input signal IS and the output signal OS. According to an example embodiment, the feedback loop includes the output terminal of the power amplifier 120 being connected to predistorter circuit 110, and the error correction circuit 130 is provided between the power amplifier 120 and the predistorter circuit 110. For example, the error correction circuit 130 is connected to the output terminal of the power amplifier 120 and an input terminal of the predistorter circuit 110 to receive the output signal OS and the input signal IS, and the error correction circuit 130 obtains a delta or a change value of the predistortion coefficient by solving a first cost function to minimize a difference between the output signal OS and the input signal IS. According to an example embodiment, the delta value of the predistortion coefficient may be minute or small. The error correction circuit 130 may update the predistortion coefficient by adding the delta value of the predistortion coefficient to the previous predistortion coefficient. The error correction circuit 130 duplicates the updated predistortion coefficient to the predistorter circuit 110, and accordingly, the predistorter circuit 110 may operate based on the updated predistortion coefficient. For example, the predistorter circuit 110 may replace the previous predistortion coefficient with the updated predistortion coefficient such that the predistorter circuit 110 may operate based on the updated predistortion coefficient.

The error correction circuit 130 may perform updating operation of the above-described predistortion coefficient until the NMSE is minimized. The error correction circuit 130 may be deactivated when the NMSE is minimized. According to an example embodiment, based on a determination that the NMSE is minimized to be within a threshold value or the NMSE satisfies a required criterion, the error correction circuit 130 may be deactivated.

According to an example embodiment, the ACLR adjustment circuit 140 is provided in the feedback loop of the electronic device 100_1. For example, similar to the error correction circuit 130, and the ACLR adjustment circuit 140 may be connected to the output terminal of the power amplifier 120 and an input terminal of the predistorter circuit 110 to receive the output signal OS and the input signal IS, and the ACLR adjustment circuit 140 may be configured to operate when the NMSE is minimized. That is, the ACLR adjustment circuit 140 may be activated and operated when the error correction circuit 130 is deactivated. However, the disclosure is not limited thereto, and as such, according to another example embodiment, the ACLR adjustment circuit 140 may be activated and operated based on a different criterion or a triggering event.

The ACLR adjustment circuit 140 calculates the ACLR from the output signal OS when the NMSE is minimized. The ACLR may be calculated based on power measured in respective channels of the output signal OS. The ACLR adjustment circuit 140 may update the predistortion coefficient to minimize the second cost function based on the ACLR. According to an example embodiment, the ACLR adjustment circuit 140 may solve the second cost function based on the input signal IS and the output signal OS and the previous predistortion coefficient before the update time, and may update the predistortion coefficient.

According to an example embodiment, the second cost function may include an $ACLR_L$ corresponding to the ACLR of the low-band adjacent channel based on the target channel of the output signal OS, an $ACLR_H$ corresponding to the ACLR of the high-band adjacent channel based on the target channel of the output signal OS, and a weight of the second cost function. Accordingly, the ACLR adjustment circuit 140 may adjust the ACLR by updating the predistortion coefficient to minimize the second cost function. Also, the ACLR adjustment circuit 140 may reduce or rebalance the ACLR by variously setting the cost function weight.

As an example, the ACLR adjustment circuit 140 may define the second cost function to minimize the sum of the $ACLR_L$ and the $ACLR_H$ by setting the weight to be relatively large. In this case, the ACLR adjustment circuit 140 may reduce the overall ACLR by minimizing the second cost function.

As an example, the ACLR adjustment circuit 140 may define the second cost function to minimize a difference between the $ACLR_L$ and the $ACLR_H$. According to an example embodiment, the ACLR adjustment circuit 140 may solve the second cost function to minimize a difference between the $ACLR_L$ and the $ACLR_H$ by setting the weight to be relatively small. In this case, the ACLR adjustment circuit 140 may rebalance the ACLR of the low-band adjacent channel and the high-band adjacent channel by minimizing the second cost function.

According to an example embodiment, the ACLR adjustment circuit may configure the cost function to minimize a sum of the $ACLR_L$ and the $ACLR_H$ by setting the weight to be a first value, and configure the cost function to minimize the difference between the $ACLR_L$ and the $ACLR_H$ by setting the weight to be a second value smaller than the first value.

The above-described electronic device 100_1 according to an example embodiment of the disclosure may minimize the NMSE between the input signal IS and the output signal OS through the predistorter circuit 110 and the error correction circuit 130 to resolve the nonlinearity of the power amplifier 120), and may also achieve reduction or rebalance of the ACLR in the process of resolving nonlinearity through the ACLR adjustment circuit 140. That is, the disclosure may satisfy the ACLR standards required by standard organizations or operators, such as 3GPP, while achieving the performance of the power amplifier 120 by performing the nonlinearity resolution in consideration of both the NMSE and ACLR viewpoints.

Hereinafter, a detailed operation of the above-described electronic device of the disclosure will be described.

As described above, the predistorter circuit 110 predistorts the input signal IS to compensate for the non-linear characteristic of the output signal OS.

Figure 2:
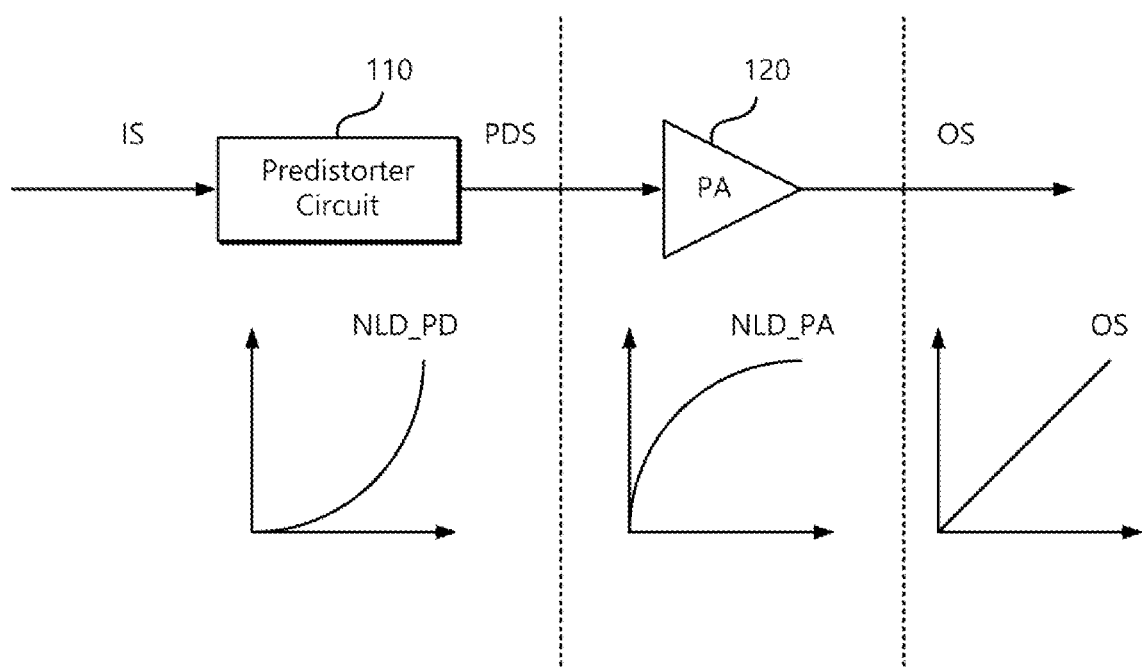
FIG. 2 is a diagram for describing a nonlinearity compensation operation of a predistorter according to an example embodiment.

FIG. 2 is a diagram for describing a nonlinearity compensation operation according to a predistorter according to an example embodiment.

Referring to FIG. 2, the power amplifier 120 has a non-linear characteristic due to a non-linear element, and thus has a non-linear distortion NPD_PA that distorts the output signal OS. The predistorter circuit 110 is connected to the input terminal of the power amplifier 120 to compensate for this nonlinearity, and is designed to have a distortion NPD_PD opposite to the nonlinear distortion NPD_PA of the power amplifier 120.

Accordingly, even when the output signal OS of the power amplifier 120 is amplified through the power amplifier 120 having the non-linear distortion NPD_PA, since it has already been converted into a signal having the opposite distortion NPD_PD through the predistorter circuit 110, the non-linear characteristic may be compensated to have a linear characteristic.

The output of the predistorter circuit 110 that performs the above-described predistortion operation, that is, the predistortion signal PDS, may be defined as $f_{DPD}(x)=X\alpha$. Here, $f_{DPD}$ is a function of the predistorter circuit 110, and X and $\alpha$ are expressed as a memory polynomial (MP) model, which is a type of Volterra series used for modeling a nonlinear system. For example, X is a vector in which the input signal IS is expressed according to the memory tap number and polynomial order of the MP model, and $\alpha$ may be a predistortion coefficient or a vector having a predistortion coefficient as an element (hereinafter, for convenience, referred to as the predistortion coefficient).

The predistortion signal PDS is amplified through the power amplifier 120 and is output as the output signal OS, and the error correction circuit 130 updates the predistortion coefficient based on the output signal OS and the input signal IS of the power amplifier 120.

Figure 3:
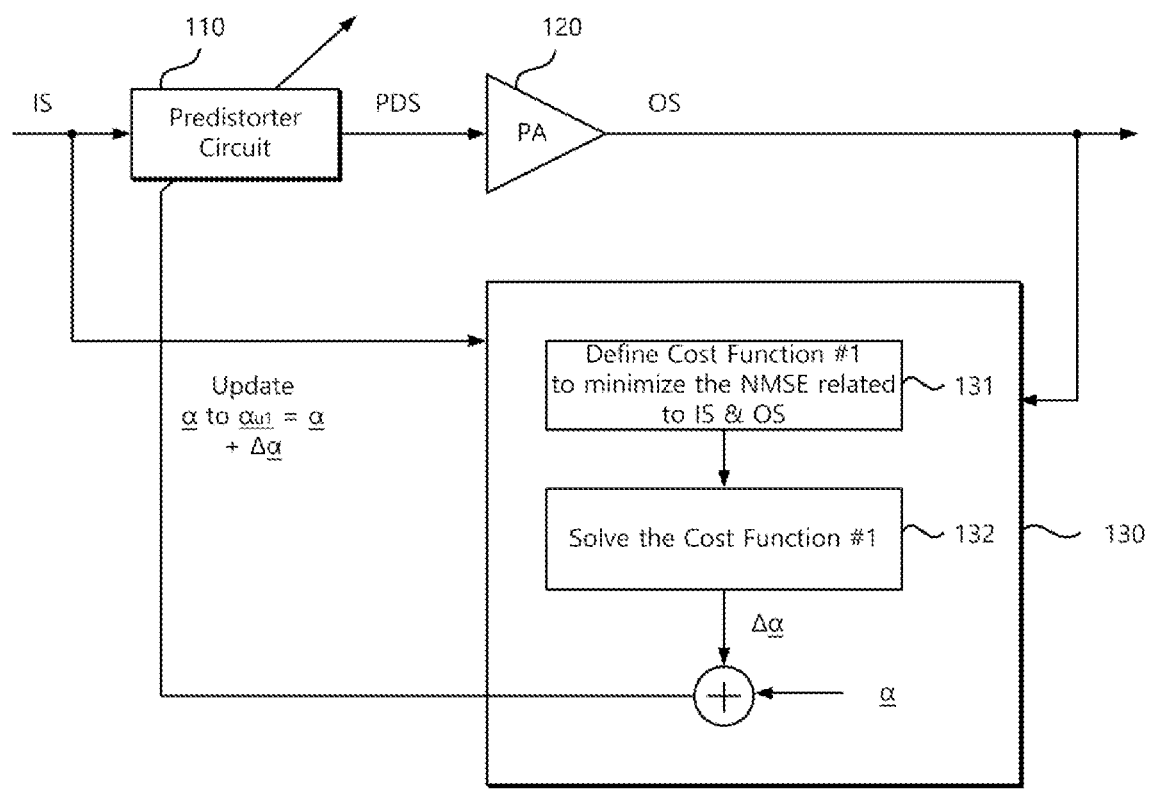
FIG. 3 is a diagram for describing an operation of a predistortion signal according to an example embodiment.

FIG. 3 is a diagram for describing an operation of a predistortion signal according to an example embodiment.

Referring to FIG. 3, the error correction circuit 130 according to an example embodiment may define a cost function (referred to as a first cost function) for minimizing the NMSE between the input signal IS and the output signal OS (131). For example, solving the first cost function may be expressed as searching for a predistortion coefficient that satisfies Equation 1 below.

$$\hat{\alpha} = \arg\min_{\alpha} \|\underline{y} - \underline{x}\|^2 = \arg\min_{\alpha} \underline{e}^H \underline{e}, \text{ where } \underline{e} = \underline{y} - \underline{x} \quad \text{[Equation 1]}$$

Here, $\hat{\alpha}$ is the predistortion coefficient that satisfies the first cost function, and y and x are vectors of the output signal OS and the input signal IS, respectively. Also, since y is the output signal OS of the power amplifier 120, it may be defined as $y=f_{PA}(X\alpha)$.

According to another example embodiment, Equation 1 may be substituted with Equation 2 below.

$$\hat{\underline{\alpha}} = \underset{\underline{\alpha}}{\arg\min} \|\underline{y} - \underline{x}\|^2 \Rightarrow \Delta\hat{\underline{\alpha}} = \qquad \text{[Equation 2]}$$

$$\arg\underset{\Delta\underline{\alpha}}{\min} \|\beta \underline{f}_{PA}(\underline{X}(\underline{\alpha} + \Delta\underline{\alpha})) - \underline{x}\|^2 \arg\underset{\Delta\underline{\alpha}}{\min} e_\Delta^H e_\Delta$$

That is, the process of solving the first cost function according to Equation 1 may be replaced with the problem of finding the delta value $\Delta\hat{\alpha}$ of the predistortion coefficient as shown in Equation 2. Here, $$\beta = \frac{\|x\|}{\|y\|},$$

$f_{PA}$ is defined as $e_\Delta = \beta f_{PA}(X(\alpha+\Delta\alpha))$, a function of the power amplifier 120.

In Equation 2, $f_{PA}(X(\alpha+\Delta\alpha))$ may be summarized as the following Equation 3.

$$\underline{f}_{PA}(\underline{X}(\underline{\alpha} + \Delta\underline{\alpha})) \simeq \qquad \text{[Equation 3]}$$

$$\underline{f}_{PA}(\underline{X\alpha}) + \frac{\partial \underline{f}_{PA}}{\partial \underline{\alpha}^T} \underline{X}\Delta\underline{\alpha} + \frac{\partial \underline{f}_{PA}}{\partial (\underline{\alpha}^*)^T} \underline{X}\Delta\underline{\alpha}^* \simeq \underline{f}_{PA}(\underline{X\alpha}) + \gamma \underline{X}\Delta\underline{\alpha}$$

Here, $$\gamma \simeq \frac{\partial \underline{f}_{PA}}{\partial \underline{\alpha}^T}.$$

Based on Equation 3, $e_\Delta$ defined in Equation 2 may be expressed by the following Equation 4.

$$e_\Delta \simeq \beta(f_{PA}(X\alpha) + \gamma X\Delta\alpha) - x = \beta y - x + \beta X\Delta\alpha \qquad \text{[Equation 4]}$$

Accordingly, based on Equation 4, the delta value $\Delta\hat{\alpha}$ of the predistortion coefficient may be expressed by the following Equation.

$$\Delta\hat{\underline{\alpha}} = \arg\underset{\Delta\underline{\alpha}}{\min} e_\Delta^H e_\Delta = \qquad \text{[Equation 5]}$$

$$\arg\underset{\Delta\underline{\alpha}}{\min} (\beta\underline{y} - \underline{x} + \beta\gamma\underline{X}\Delta\underline{\alpha})^H (\beta\underline{y} - \underline{x} + \beta\gamma\underline{X}\Delta\underline{\alpha}),$$

$$\therefore \Delta\hat{\underline{\alpha}} = ((\beta\gamma\underline{X})^H \beta\gamma\underline{X})^{-1} (\beta\gamma\underline{X})^H (\beta\underline{y} - \underline{x})$$

As a result, solving the first cost function may be replaced by solving Equation 5. Accordingly, the error correction circuit 130 may estimate or obtain the delta value $\Delta\hat{\alpha}$ of the predistortion coefficient by solving Equation 5 (132). For example, the error correction circuit 130 may solve Equation 5 based on various regression analysis algorithms such as least squares method, and may estimate or obtain the delta value $\Delta\hat{\alpha}$ of the predistortion coefficient.

The error correction circuit 130 may update the predistortion coefficient to a new predistortion coefficient $\alpha_{u1}$ by adding the delta value $\Delta\hat{\alpha}$ of the finally obtained predistortion coefficient from solving the cost function to the previous predistortion coefficient $\alpha$.

Since the update operation of the error correction circuit 130 is performed on the predistorter circuit 110, the predistortion coefficient for the predistortion operation of the predistorter circuit 110 is updated with the new predistortion coefficient $\alpha_{u1}$.

As an example embodiment, the error correction circuit 130 may add $\mu\Delta\hat{\alpha}$ obtained by multiplying the delta value $\Delta\hat{\alpha}$ of a predistortion coefficient for update by a step size 'μ' to the previous predistortion coefficient. The step size 'μ' may be variously set according to the design goal of the NMSE minimization operation of the error correction circuit 130. Also, 'γ' in Equation 3 may be determined according to the step size 'μ'.

The error correction circuit 130 may minimize the NMSE between the input signal IS and the output signal OS based on the above-described embodiments. However, when only the error correction circuit 130 is provided to the predistorter circuit 110, the nonlinearity compensation is performed only from the NMSE viewpoint, and the ACLR viewpoint is not considered.

Therefore, the error correction circuit 130 according to an example embodiment is configured to be deactivated when the NMSE is minimized. When the error correction circuit 130 is deactivated, the ACLR adjustment circuit 140 is activated and operated, so that even the ACLR viewpoint may be considered for nonlinearity compensation. Hereinafter, the operation of the ACLR adjustment circuit 140 will be described in detail.

Figure 4:
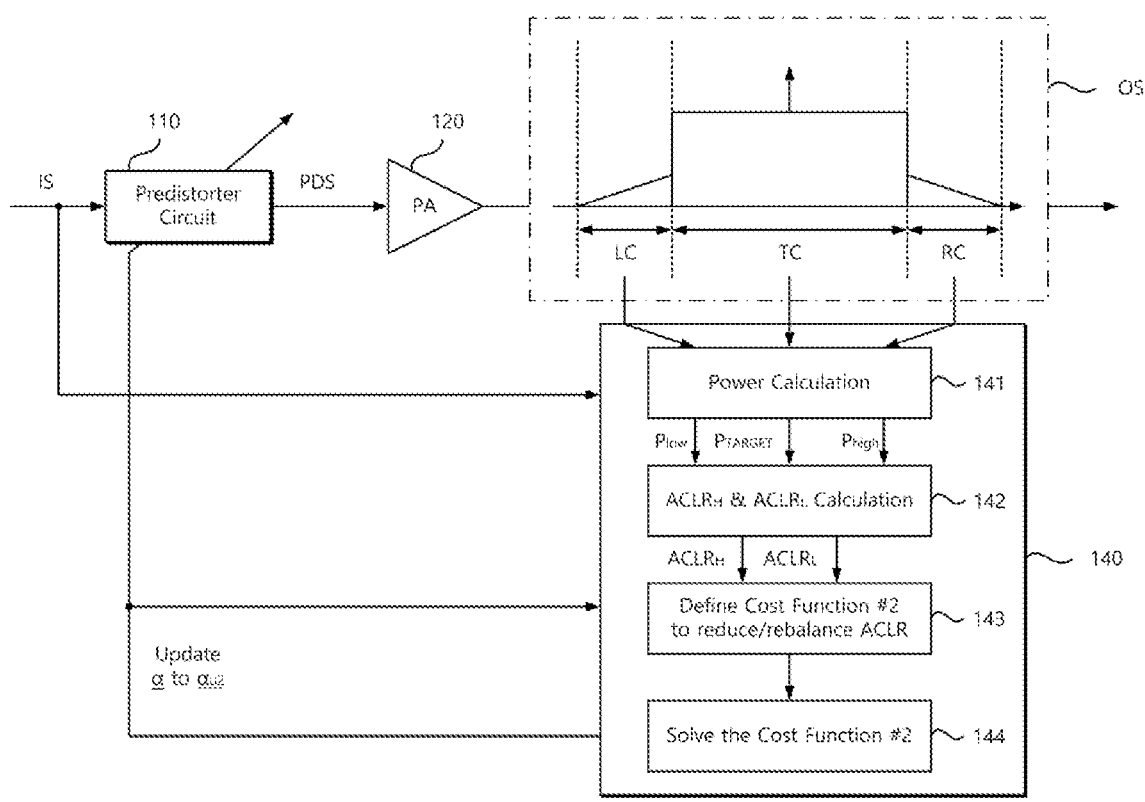
FIG. 4 is a diagram for describing an operation of an ACLR adjustment unit according to an example embodiment.

FIG. 4 is a diagram for describing an operation of an ACLR adjustment circuit according to an example embodiment.

Referring to FIG. 4, the ACLR adjustment circuit 140 according to an example embodiment first calculates the ACLR from the output signal OS of the power amplifier 120.

As illustrated, the output signal OS has a leakage component in a low-band adjacent channel and a high-band adjacent channel adjacent to the target channel due to the nonlinearity of the power amplifier 120. Accordingly, the ACLR adjustment circuit 140 calculates $P_{TARGET}$ defined as the power of the target channel from the target channel, calculates $P_{low}$ defined as the power of the low-band adjacent channel from the low-band adjacent channel, and calculates $P_{high}$ defined as the power of the high-band adjacent channel from the high-band adjacent channel (141).

In an example embodiment, the ACLR adjustment circuit 140 calculates $P_{TARGET}$, $P_{low}$ and $P_{high}$ based on Equations 6 to 8 below.

$$P_{target}=10\log_{10}\|y_{f,target}/N\|^2, y_{f,target}=E_{target}Dy= [O_{N\times N'}I_{N\times N}O_{N\times N''}]Dy \qquad \text{[Equation 6]}$$

$$P_{low}=10\log_{10}\|y_{f,low}/N\|^2, y_{f,low}=E_{low}Dy=[I_{N\times N}O_{N\times N''}] Dy \qquad \text{[Equation 7]}$$

$$P_{high}=10\log_{10}\|y_{f,high}/N\|^2, y_{f,high}=E_{high}Dy= [O_{N\times N''}I_{N\times N}]Dy \qquad \text{[Equation 8]}$$

Here, $y_{f,target}$ the output signal OS of the target channel, $y_{f,low}$ is the output signal OS of the low-band adjacent channel, and $y_{f,high}$ is the output signal OS of the high-band adjacent channel. The output signal OS in each channel may be obtained based on the identity matrices ($E_{target}$, $E_{low}$, and $E_{high}$), which are defined to extract the components in each channel as shown in Equations 6 to 8, D, and y, which is the output signal OS. D may be frequency domain data in which y, which is the output signal OS, is converted into the frequency domain. For example, D may be a DFT matrix transformed through a Discrete Fourier Transform (DFT). N is the total number of samples used for the Fourier transform, and may be determined according to a sampling frequency of the Fourier transform and an observation time of the output signal OS. N' and N" may be the number of remaining samples used for power measurement for each channel among the output signals OS. For example, N' may be set to have a value of the number of samples corresponding to channels other than the target channel such that only the target channel can be extracted as shown in Equation 6. In addition, N" may be set to have a value of the number of samples corresponding to the remaining channels except for the target channel and the high-band adjacent channel or the remaining channels except for the target channel and the low-band adjacent channel such that only the low-band adjacent channel or the high-band adjacent channel is extracted as shown in Equation 7 or 8.

The ACLR adjustment circuit 140 calculates the ACLR based on the power for each channel calculated based on Equations 6 to 8 (142). Specifically, the ACLR adjustment circuit 140 calculates the $ACLR_L$ defined as the ACLR of the low-band adjacent channel and the $ACLR_H$ defined as the ACLR of the high-band adjacent channel based on the calculated power for each channel. For example, the ACLR adjustment circuit 140 may calculate each ACLR based on Equations 9 to 10 below.

$$ACLR_L = P_{low} - P_{target} \quad \text{[Equation 9]}$$

$$ACLR_H = P_{high} - P_{target} \quad \text{[Equation 10]}$$

The ACLR adjustment circuit 140 may define a second cost function for reducing or rebalancing the ACLR based on the ACLR calculated through Equations 9 to 10 (143). The second cost function may be defined by Equation 11 below.

$$C = \gamma(ACLR_L + ACLR_H) + (1-\gamma)|ACLR_L - ACLR_H|,$$
$$0 \leq \gamma \leq 1 \quad \text{[Equation 11]}$$

Here, $\gamma$ is a weight of the second cost function. The second cost function has a term defined as the sum of each ACLR (e.g., ACLRL+ACLRH) and a term defined as a difference between each ACLR (e.g., ACLRL+ACLRH) as shown in Equation 11. The terms are defined as trade-off relationships according to their weights. Accordingly, the second cost function may be defined to minimize the sum of the ACLRs or the difference between the ACLRs according to the adjustment of the weights.

In an example embodiment, the ACLR adjustment circuit 140 may reduce the overall amount of the ACLR of the output signal OS by setting the weight to be relatively large and defining the second cost function to minimize the sum of the $ACLR_L$ and the $ACLR_H$.

In an example embodiment, the ACLR adjustment circuit 140 may re-adjust the ACLR of the low-band adjacent channel and the ACLR of the high-band adjacent channel by setting the weight to be relatively small and defining the second cost function to minimize the difference between $ACLR_L$ and $ACLR_H$.

The ACLR adjustment circuit 140 updates the predistortion coefficient by solving the defined second cost function (144). The second cost function may be expressed by Equation 12 below by substituting Equations 6 to 10 into the second cost function of Equation 11.

$$C = \gamma\left(10\log_{10}\left\|\frac{y_{f,low}}{N}\right\|^2 + 10\log_{10}\left\|\frac{y_{f,high}}{N}\right\|^2 - \right. \quad \text{[Equation 12]}$$

$$\left. 20\log_{10}\left\|\frac{y_{f,target}}{N}\right\|^2\right) + (1-\gamma)\left|10\log_{10}\left\|\frac{y_{f,low}}{N}\right\|^2 - \right.$$

$$\left. 10\log_{10}\left\|\frac{y_{f,high}}{N}\right\|^2\right|$$

Equation 12 may be summarized through the following Equations 13 and 14.

$$C = \gamma\left(10\log_{10}\left\|\frac{E_{low}Dy}{N}\right\|^2 + 10\log_{10}\left\|\frac{E_{high}Dy}{N}\right\|^2 - \right. \quad \text{[Equation 13]}$$

$$\left. 20\log_{10}\left\|\frac{E_{target}Dy}{N}\right\|^2\right) + (1-\gamma)\left|10\log_{10}\left\|\frac{E_{low}Dy}{N}\right\|^2 - \right.$$

$$\left. 10\log_{10}\left\|\frac{E_{high}Dy}{N}\right\|^2\right|$$

$$C = \quad \text{[Equation 14]}$$
$$\gamma\left(10\log_{10}\left\|\frac{E_{low}Df_{PA}(X\alpha)}{N}\right\|^2 + 10\log_{10}\left\|\frac{E_{high}Df_{PA}(X\alpha)}{N}\right\|^2 - \right.$$
$$\left. 20\log_{10}\left\|\frac{E_{target}Df_{PA}(X\alpha)}{N}\right\|^2\right) + (1-\gamma)$$
$$\left|10\log_{10}\left\|\frac{E_{low}Df_{PA}(X\alpha)}{N}\right\|^2 - 10\log_{10}\left\|\frac{E_{high}Df_{PA}(X\alpha)}{N}\right\|^2\right|$$

Consequently, the second cost function may be defined as a function of the predistortion coefficient $\alpha$ as shown in Equation 14.

The ACLR adjustment circuit 140 solves the second cost function according to Equations 12 to 14 based on various optimization algorithms with the input signal IS, the output signal OS, and the previous predistortion coefficient $\alpha$ to obtain a new predistortion coefficient $\alpha_{u2}$ that minimizes the second cost function. The ACLR adjustment circuit 140 may update the previous predistortion coefficient $\alpha$ with the new predistortion coefficient $\alpha_{u2}$.

In an example embodiment, the ACLR adjustment circuit 140 may solve the second cost function based on various algorithms. For example, the ACLR adjustment circuit 140 may obtain the new predistortion coefficient $\alpha_{u2}$ that minimizes the second cost function based on a Newton technique considering that the second cost function has a nonlinear relationship with the predistortion coefficient $\alpha$. For example, when the Newton technique is applied, the ACLR adjustment circuit 140 may use a quasi-Newton technique to numerically obtain a Jacobian and a hessian of the second cost function.

In an example embodiment, the ACLR adjustment circuit 140 may solve the second cost function by using a Broyden-Fletcher-Goldfarb-Shanno (BFGS) algorithm, which is a kind of quasi-Newtonian technique. The ACLR adjustment circuit 140 may reduce the amount of computation used for the Hessian by updating the Hessian to the Jacobian through the BFGS algorithm. When the BFGS algorithm is used, the predistortion coefficient may be redefined as $\alpha^{new} = [\text{Real}(\alpha^T) \text{Imag}(\alpha^T)]^T$. The ACLR adjustment circuit 140 may solve the second cost function based on the redefined predistortion coefficient $\alpha^{new}$.

The ACLR adjustment circuit 140 may update the predistorter circuit 110 by acquiring the new predistortion coefficient that minimizes the second cost function according to the above-described embodiments. In an example embodiment, the ACLR adjustment circuit 140 may perform an ACLR reduction operation or an ACLR rebalance operation according to a first condition set for the NMSE and a second condition set for the predistortion coefficient. When the update time of the predistortion coefficient is a time k+1 (here, 'k' is a natural number), the first condition may be defined as a condition in which the NMSE corresponding to the time k+1 is less than a preset NMSE threshold value τ1. The second condition may be defined as a condition in which a difference value between the predistortion coefficient corresponding to the k+1 time and the predistortion coefficient corresponding to the k time is less than a coefficient threshold value τ2.

When the predistortion coefficient is updated, the ACLR adjustment circuit 140 according to an example embodiment may compare the NMSE corresponding to the update time k+1, which is the update time, with the NMSE threshold value τ1. According to the comparison result, when it is determined that the NMSE corresponding to the time k+1 is less than the preset NMSE threshold τ1, the ACLR adjustment circuit 140 stops the update operation.

The ACLR adjustment circuit 140 according to an example embodiment may compare the difference value between the predistortion coefficient corresponding to the k+1 time and the predistortion coefficient corresponding to the k time with the coefficient threshold value τ2. According to the comparison result, when it is determined that the difference value is less than the coefficient threshold τ2, the ACLR adjustment circuit 140 stops the update operation.

Alternatively, the ACLR adjustment circuit 140 may stop the update operation when at least one of the first condition and the second condition is satisfied.

According to the above-described example embodiments, the ACLR adjustment circuit 140 of the disclosure may improve the quality of a channel by symmetrically controlling the ACLR of an adjacent channel. In particular, the ACLR adjustment circuit 140 may reduce the overall ACLR by minimizing the sum of ACLRs by adjusting the weights, or may minimize the difference between the ACLRs and perform the symmetrical control of ACLRs to improve channel quality.

Figure 5:
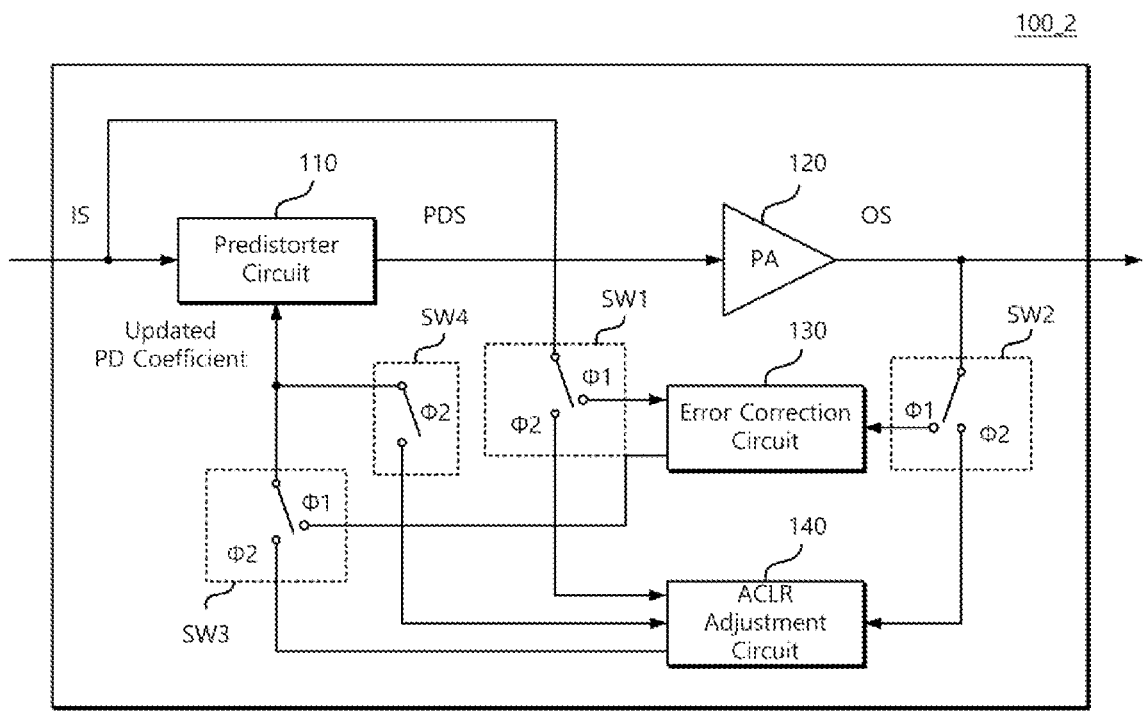
FIG. 5 is a diagram illustrating an electronic device according to another example embodiment of the disclosure.

FIG. 5 is a diagram illustrating an electronic device according to another example embodiment of the disclosure.

Referring to FIG. 5, according to another example embodiment, an electronic device 100_2 includes a plurality of switches in addition to the electronic device 100_1 of FIG. 1 described above. According to an example, embodiment, the plurality of switches may include a first switch SW1 connected to an input terminal to which the input signal IS is applied, a second switch SW2 connected to an output terminal of the power amplifier 120, a third switch SW3 connected to the predistorter circuit 110, and a fourth switch connected to the predistorter circuit 110 and the ACLR adjustment circuit 140.

The plurality of switches operate according to a first phase Φ1 and a second phase Φ2 in common.

In the first phase Φ1, the first switch SW1 is connected to the input terminal and the error correction circuit 130, and the second switch SW2 is connected to the output terminal of the power amplifier 120 and the error correction circuit 130, the third switch SW3 is connected to the predistorter circuit 110 and the error correction circuit 130, and the fourth switch SW4 is in an off state. Accordingly, in the first phase Φ1, the error correction circuit 130 is activated and the ACLR adjustment circuit 140 is deactivated to perform the NMSE minimization operation. During the first phase Φ1, the error correction circuit 130 performs various operations for minimizing the NMSE based on the above-described embodiments. In one embodiment, the error correction circuit 130 obtains the delta value $\Delta\hat{\alpha}$ of the predistortion coefficient satisfying Equation 1 by solving the first cost function based on the input signal IS and the output signal OS, and updates the predistortion coefficient with the new predistortion coefficient $\alpha_{u1}$ by adding the delta value $\Delta\hat{\alpha}$ of the obtained predistortion coefficient to the previous predistortion coefficient α.

In the second phase Φ2, the first switch SW1 is connected to the input terminal and the ACLR adjustment circuit 140, and the second switch SW2 is connected to the output terminal of the power amplifier 120 and the ACLR adjustment circuit 140, the third switch SW3 is connected to the predistorter circuit 110 and the ACLR adjustment circuit 140, and the fourth switch SW4 is connected to the predistorter circuit 110 and the ACLR adjustment circuit 140. Accordingly, in the second phase Φ2, the error correction circuit 130 is deactivated and the ACLR adjustment circuit 140 is activated to perform the ACLR reduction operation or the ACLR rebalance operation. During the second phase Φ2, the ACLR adjustment circuit 140 performs various operations for reducing or rebalancing the ACLR based on the above-described embodiments. In one embodiment, the ACLR adjustment circuit 140 may obtain the new predistortion coefficient $\alpha_{u2}$ capable of solving the second cost function based on the input signal IS, the output signal OS, and the previous predistortion coefficient α, and may update the previous predistortion coefficient α with the new predistortion coefficient $\alpha_{u2}$. In this case, the updated predistortion coefficient is fed back to the ACLR adjustment circuit 140 through the fourth switch SW4 and may be used as the previous predistortion coefficient at a subsequent update time.

Hereinafter, a method of operating an electronic device according to the above-described embodiments will be described.

Figure 6:
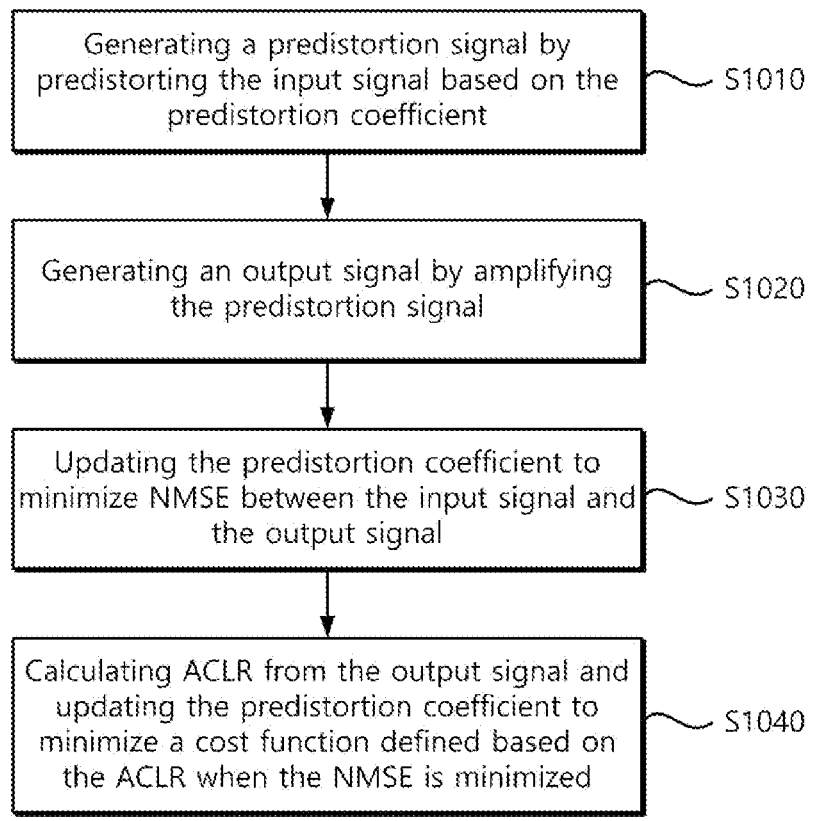
FIG. 6 is a flowchart of a method of operating an electronic device according to an example embodiment of the disclosure.

FIG. 6 is a flowchart of a method of operating an electronic device according to an example embodiment of the disclosure.

Referring to FIG. 6, the electronic devices 100_1 and 100_2 according to an example embodiment predistort the input signal IS based on the predistortion coefficient to generate the predistortion signal PDS (S1010). As described above, operation S1010 may be repeatedly performed until the NMSE is minimized or the ACLR is reduced or rebalanced to satisfy the second cost function. In an initial iteration order, operation S1010 may be performed based on an initial value ao of the predistortion coefficient.

The electronic devices 100_1 and 100_2 amplify the predistortion signal PDS generated in operation S1010 to generate the output signal OS (S1020). The output signal OS is output nonlinearly due to the nonlinear characteristics of the power amplifier 120, but as the predistortion coefficient is optimized by the error correction circuit 130 and the ACLR adjustment circuit 140, the nonlinearity may be compensated.

The electronic devices 100_1 and 100_2 update the predistortion coefficient to minimize the NMSE between the input signal IS and the output signal OS (S1030). To this end, the input signal IS and the output signal OS generated in operation S1020 may be fed back. Operation S1030 may be repeatedly performed until the NMSE is minimized, that is, until the first cost function is minimized.

According to an example embodiment, in operation S1040, the electronic devices 100_1 and 100_2 calculate the ACLR from the output signal OS, and update the predistortion coefficient to minimize the second cost function defined based on the ACLR. For example, when the NMSE is minimized in operation S1030, the electronic devices 100_1 and 100_2 calculate the ACLR from the output signal OS and update the predistortion coefficient to minimize the second cost function defined based on the ACLR (S1040). As in the above description, operation S1040 may be repeatedly performed until the second cost function is minimized.

Figure 7:
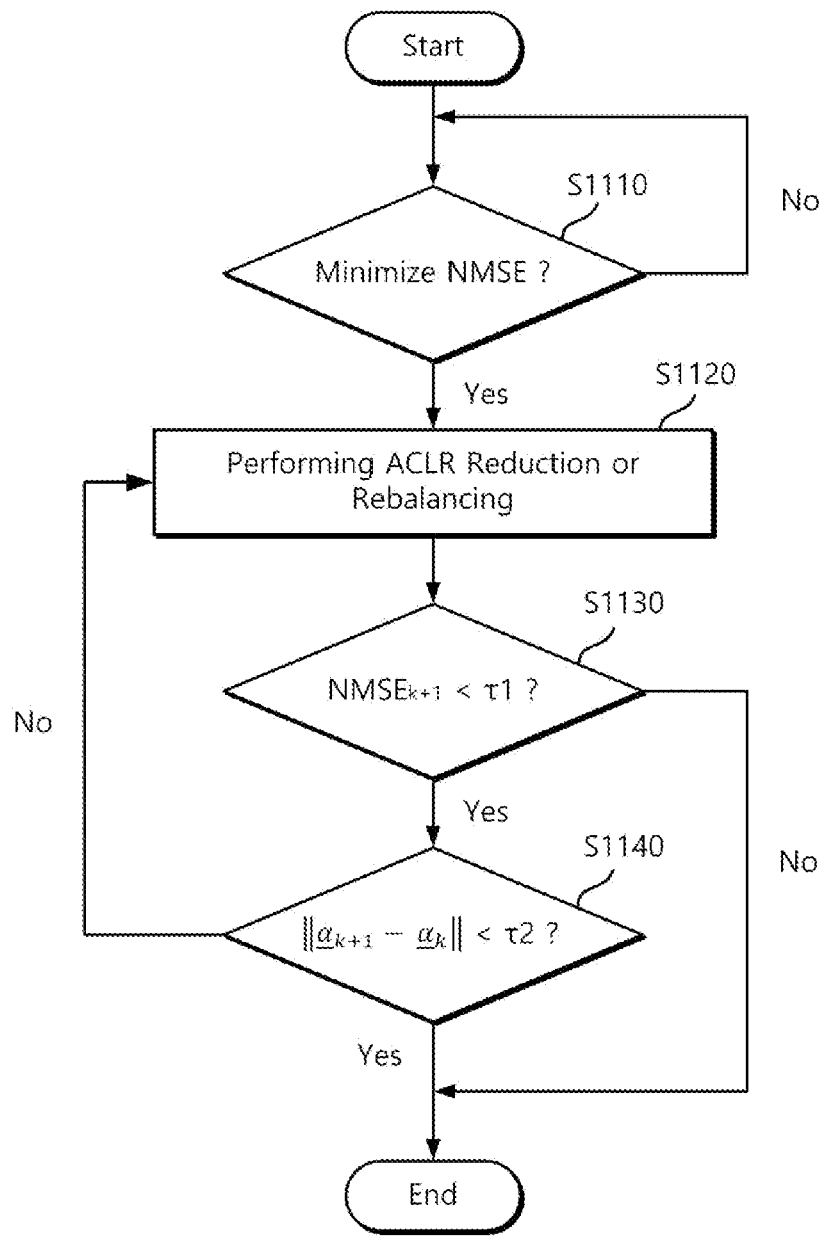
FIG. 7 is a flowchart of a method of operating an electronic device according to another example embodiment of the disclosure.

FIG. 7 is a flowchart of a method of operating an electronic device according to another example embodiment of the disclosure.

Referring to FIG. 7, the electronic devices 100_1 and 100_2 according to another example embodiment perform a minimization operation of the NMSE (S1110). For example, the electronic devices 100_1 and 100_2 may perform the minimization operation of the NMSE based on the first cost function according to the above-described embodiments. Operation S1110 may be repeatedly performed until the NMSE is minimized.

When the NMSE is minimized according to operation S1110, the electronic devices 100_1 and 100_2 perform the ACLR reduction operation or the ACLR rebalance operation (S1120).

The electronic devices 100_1 and 100_2 continuously update the predistortion coefficient according to the ACLR reduction operation or the ACLR rebalance operation, and determine whether the NMSE corresponding to the update time is less than the preset NMSE threshold value τ1 (S1130).

When it is determined that the NMSE is less than the preset NMSE threshold value τ1 according to operation S1130, the electronic devices 100_1 and 100_2 end the ACLR reduction operation or the ACLR rebalance operation. Alternatively, when it is determined that the NMSE is equal to or greater than the preset NMSE threshold value τ1 in operation S1130, the electronic devices 100_1 and 100_2 compare the difference value between the predistortion coefficient corresponding to the k+1 time and the predistortion coefficient corresponding to the k time with the coefficient threshold value τ2 (S1140).

When it is determined that the difference value is less than the coefficient threshold value τ2 in operation S1140, the electronic devices 100_1 and 100_2 end the ACLR reduction operation or the ACLR rebalance operation. Alternatively, when it is determined that the difference value is equal to or greater than the coefficient threshold value τ2 according to operation S1140, the electronic devices 100_1 and 100_2 may repeatedly perform operations S1120 to S1140.

In FIG. 7, operations S1130 and S1140 are illustrated as being performed at different times, but may be performed simultaneously according to the above-described embodiment.

Figure 8:
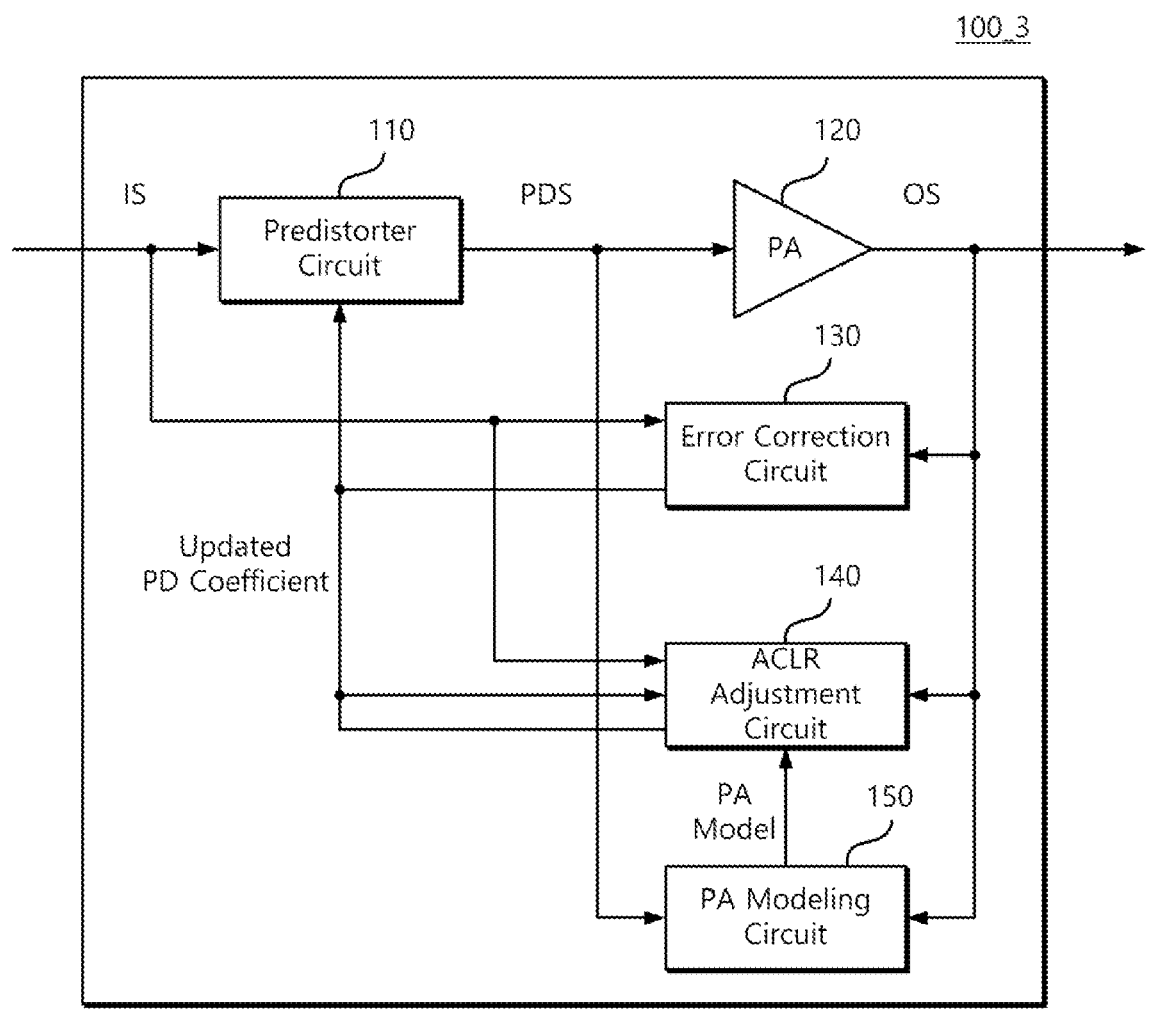
FIG. 8 is a diagram illustrating an electronic device according to another example embodiment of the disclosure.

FIG. 8 is a diagram illustrating an electronic device according to another example embodiment of the disclosure.

Referring to FIG. 8, an electronic device 100_3 according to another example embodiment may further include a power amplifier (PA) modeling circuit 150 in addition to the above-described components. The PA modeling circuit 150 models the power amplifier 120 from the predistortion signal PDS and the output signal OS. The PA modeling circuit 150 may transfer a modeled PA model (power amplifier model) to the ACLR adjustment circuit 140.

It is the same as described above that the second cost function may be defined as a function related to the predistortion coefficient as in Equation 14. When the second cost function is solved according to an optimization algorithm such as the quasi-Newton technique, the new predistortion coefficient $\alpha_{u2}$ may be defined as $\alpha_0 - \mu H(\alpha)^{-1} J(\alpha)$. Here, $\alpha_0$ is the initial value of the predistortion coefficient, $\mu$ is the step size for the above-described update operation, and H and J are Hessian and Jacobian matrices for the second cost function, respectively. The Hessian may be defined as $$H(\alpha) = \frac{\partial^2 C(\alpha)}{\partial \alpha \partial \alpha^H},$$

and Jacobian may be defined as $$J(\alpha) = \frac{\partial C(\alpha)}{\partial \alpha}.$$

To numerically obtain the Hessian and Jacobian, it may be necessary to obtain the output signal OS by passing the predistortion signal PDS through the power amplifier 120 in proportion to the number of predistortion coefficients.

Accordingly, the electronic device 100_3 according to another example embodiment additionally includes the PA modeling circuit 150 to model the power amplifier 120 to be represented by the input signal IS and the PA modeling coefficient, thereby reducing the operation of generating the output signal OS required for calculating the Hessian and the Jacobian.

The PA modeling circuit 150 may model the power amplifier 120 as shown in Equation 15 below.

$$f_{PA}(s) \approx S\alpha_{PA} \quad \text{[Equation 15]}$$

Here, $f_{PA}$ is the PA model, S is a vector of a predistortion signal PDS expressed based on the MP model, and $\alpha_{PA}$ is a PA modeling coefficient. S and $\alpha_{PA}$ may be defined according to the number of memory taps and the polynomial order.

The PA modeling circuit 150 may estimate or obtain the PA modeling coefficient of Equation 15 based on various optimization algorithms. The PA modeling circuit 150 may transfer the PA model defined by the estimated or acquired PA modeling coefficients to the ACLR adjustment circuit 140, and the ACLR adjustment circuit 140 may utilize the PA model to efficiently minimize the second cost function.

In an example embodiment, the error correction circuit 130 may update the predistortion coefficient based on the input signal IS and the output signal OS as described above in the first phase. The ACLR adjustment circuit 140 may update the predistortion coefficient by using the input signal IS, the output signal OS, the previous predistortion coefficient, and the PA model in the second phase.

Figure 9:
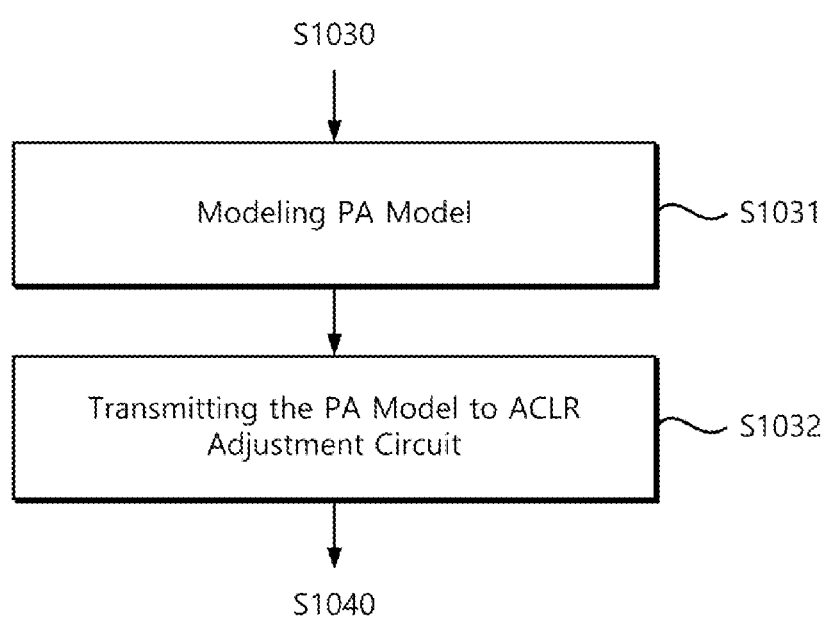
FIG. 9 is a flowchart of a method of operating an electronic device according to another example embodiment of the disclosure.

FIG. 9 is a flowchart of a method of operating an electronic device according to another example embodiment of the disclosure.

Referring to FIG. 9, according to another example embodiment, the electronic device 100_3 models a PA model (S1031). The PA modeling may be performed, for example, based on Equation 15. The electronic device 100_3 may perform operation S1031 through various optimization algorithms such as the least squares method.

The electronic device 100_3 transmits the modeled PA model to the ACLR adjustment circuit 140 (S1032). The ACLR adjustment circuit 140 may calculate the ACLR by using the PA model and may perform operation S1040 of minimizing the second cost function.

According to the above-described embodiment, the disclosure may reduce the amount of computation used to obtain the Hessian when solving the second cost function based on the quasi-Newton technique by generating the PA model modeling the power amplifier 120 and performing the ACLR reduction operation or the ACLR rebalance operation using the PA model.

Figure 10:
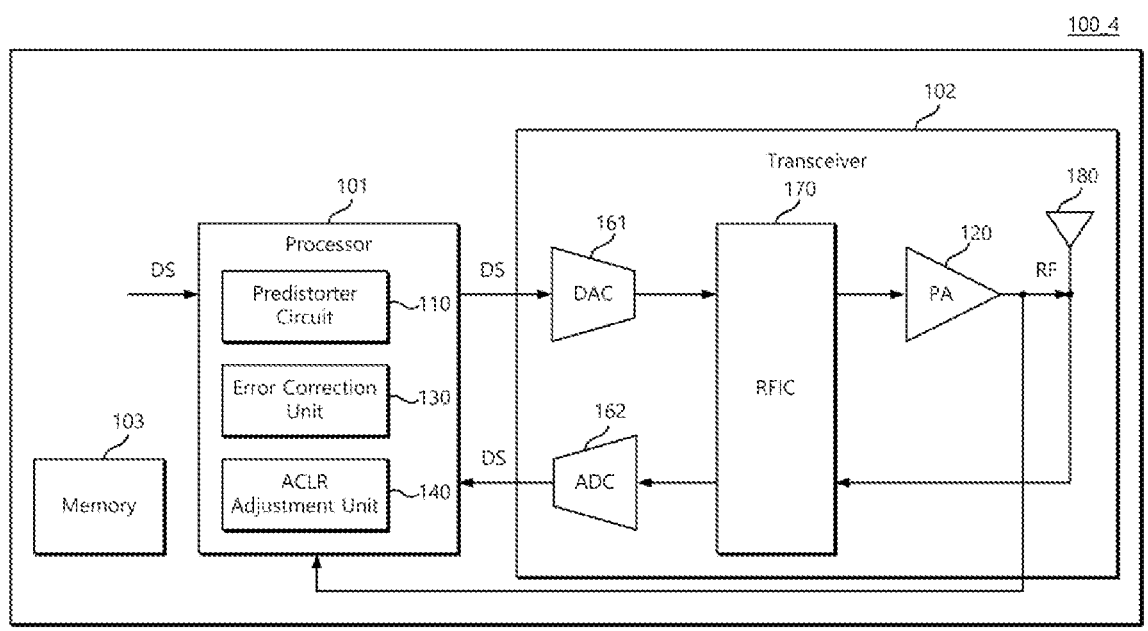
FIG. 10 is a diagram illustrating an electronic device according to another example embodiment of the disclosure.

FIG. 10 is a diagram illustrating an electronic device according to another example embodiment of the disclosure.

Referring to FIG. 10, an electronic device 100_4 according to another example embodiment includes a processor 101 and a transceiver 102. According to an example embodiment, the electronic device 100_4 may further include a memory 103. However, the disclosure is not limited thereto.

As illustrated in FIG. 10, the processor 101 may be configured to include a predistorter unit 110 corresponding to predistorter circuit 110 described in the above embodiments, an error correction unit 130 corresponding to the error correction circuit 130 described in the above embodiments, and an ACLR adjustment unit corresponding to the ACLR adjustment circuit 140 described in the above embodiments, and may perform the same or similar operations of these circuits. Alternatively, the processor 101 may include a PA modeling unit corresponding to the above-described PA modeling circuit 150. For example, the processor 101 may predistort a digital signal DS through the predistorter unit 110 in FIG. 10, may minimize the NMSE to compensate for nonlinearity of the power amplifier 120, and may reduce or rebalance the ACLR.

According to an example embodiment, the transceiver 102 may be connected to various wireless communication systems that support a multiple input, multiple output (MIMO) antenna technology. For example, the MIMO antenna technology is a multi-antenna technology, such as a long-term evolution (LTE) system, a long-term evolution-advanced (LTE-A) system, an LTE-A pro system, and a 5G system, which are proposed by 3GPP (3rd Generation Partnership Project), and transmits and receives radio signals to and from a terminal or base station. A radio frequency RF signal may include various control information and data. The digital signal DS may be converted into an analog signal through a digital to analog converter (DAC) 161, and the RF signal received from the antenna 180 may be converted into the digital signal DS through an analog to digital converter (ADC) 162. A radio-frequency integrated circuit (RFIC) 170 may up-convert a frequency of a baseband signal (e.g., a signal converted to analog through the DAC 161) to generate an RF signal for transmission, or may down-convert a frequency of the RF signal (e.g., a signal received through an antenna 180) to convert it into a baseband signal.

According to the processor 101 described above, the nonlinearity of the RF signal output through the power amplifier 120 is compensated, and the asymmetry of the ACLR may be resolved, so that the quality of the signal may be improved.

According to an example embodiment, at least one of the circuits, units, elements or components (collectively, components) represented by a block in the drawings may be implemented hardware, software or a combination of hardware and software. For example, according to an example embodiment, the components may be implemented with various hardware devices, such as an integrated circuit, an application specific integrated circuit (ASIC), a field programmable gate array (FPGA), and a complex programmable logic device (CPLD), firmware driven in hardware devices, software such as an application, or a combination of a hardware device and software. Also, the components may include semiconductor devices in an integrated circuit, or may be enrolled as an intellectual property (IP).

According to an example embodiment, the components, when configured with the described functionality defined in the disclosure will result in a novel hardware, or may be considered as a special purpose processor. However, the disclosure is not limited thereto, and as such, the disclosure may be implemented in another way according to various other example embodiment.

In addition, the diverse example embodiments described above may be implemented in a computer or an apparatus similar to the computer using software, hardware, or a combination of software and hardware. In some cases, example embodiments described in the disclosure may be implemented as a processor itself. According to a software implementation, embodiments such as procedures and functions described in the specification may be implemented as separate software modules. Each of the software modules may perform one or more functions and operations described in the specification. According to an example embodiment, the memory 103 may store program codes and/or computer instructions to instruct the processor 101 to implement one or more functions and operations described in the specification. For example, the processor 101 may execute the program codes and/or the computer instructions stored in the memory 103 and implement the units or modules described in the specification.

Meanwhile, computer instructions for performing processing operations according to the diverse example embodiments of the disclosure described above may be stored in a non-transitory computer-readable medium. The computer instructions stored in the non-transitory computer-readable medium may cause a specific device to perform the processing operations according to the diverse embodiments described above when they are executed by a processor.

The non-transitory computer-readable medium is not a medium that stores data for a while, such as a register, a cache, a memory, or the like, but means a medium that semi-permanently stores data and is readable by the device. Specific examples of the non-transitory computer-readable medium may include a compact disk (CD), a digital versatile disk (DVD), a hard disk, a Blu-ray disk, a USB, a memory card, a read only memory (ROM), and the like.

According to an example embodiment of the disclosure, an electronic device capable of resolving a nonlinearity of a power amplifier by reducing or rebalancing an ACLR while minimizing an NMSE between an input signal and an output signal, and an operating method thereof may be provided.

The above descriptions are specific embodiments for carrying out the disclosure. Embodiments in which a design is changed simply or which are easily changed may be included in the disclosure as well as an example embodiment described above. In addition, technologies that are easily changed and implemented by using the above embodiments may be included in the disclosure. While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. An electronic device comprising:
   a predistorter circuit configured to predistort an input signal based on a predistortion coefficient to generate a predistortion signal;
   a power amplifier configured to amplify the predistortion signal to generate an output signal;

an error correction circuit configured to update the predistortion coefficient to minimize a Normalized Mean Square Error (NMSE) between the input signal and the output signal; and an Adjacent Channel Leakage Ratio (ACLR) adjustment circuit configured to operate based on a determination that the NMSE is minimized to:

calculate an ACLR from the output signal of the power amplifier, and update the predistortion coefficient to minimize a cost function based on the ACLR, wherein the cost function is defined as follows:

$$C=\gamma(ACLR_L+ACLR_H)+(1-\gamma)|ACLR_L-ACLR_H|,$$
$$0\leq\gamma\leq1$$

wherein, C is the cost function, $\gamma$ is a weight of the cost function, $ACLR_L$ is a low ACLR corresponding to a low-band adjacent channel based on a target channel of the output signal and $ACLR_H$ is a high ACLR corresponding to a high-band adjacent channel based on the target channel of the output signal.

2. The electronic device of claim 1, further comprising:
a power amplifier modeling circuit configured to model the power amplifier as a function of the predistortion coefficient from the predistortion signal and the output signal.

3. The electronic device of claim 1, wherein the ACLR adjustment circuit updates the predistortion coefficient to minimize the cost function by minimizing a sum of the low ACLR and the high ACLR by setting the weight to be a first value, and minimizing a difference between the low ACLR and the high ACLR by setting the weight to be a second value smaller than the first value.

4. The electronic device of claim 1, wherein, based on the NMSE being minimized, the error correction circuit is configured to be deactivated, and the ACLR adjustment circuit is configured to be activated.

5. The electronic device of claim 1, wherein the ACLR adjustment circuit, based on the predistortion coefficient being updated, is configured to:
compare the NMSE corresponding to a time k+1, which is an update time with an NMSE threshold value, k being a natural number, and
compare a difference value between the predistortion coefficient corresponding to the k+1 time and the predistortion coefficient corresponding to a time k with a coefficient threshold value.

6. The electronic device of claim 5, wherein the ACLR adjustment circuit is configured to stop updating the predistortion coefficient based on at least one of:
the NMSE corresponding to the k+1 time being less than the NMSE threshold value, and
the difference value being less than the coefficient threshold value.

7. The electronic device of claim 1, further comprises:
a first switch comprising a first end connected to an input terminal to which the input signal is applied and a second end configured to switch between the error correction circuit and the ACLR adjustment circuit,
a second switch comprising a first end connected to an output terminal of the power amplifier and a second end configured to switch between the error correction circuit and the ACLR adjustment circuit,
a third switch comprising a first end connected to the predistorter circuit and a second end configured to switch between the error correction circuit and the ACLR adjustment circuit, and a fourth switch is arranged between the predistorter circuit and the ACLR adjustment circuit.

8. The electronic device of claim 7, wherein, in a first phase, the first switch is connected to the input terminal and the error correction circuit, the second switch is connected to the output terminal of the power amplifier and the error correction circuit, the third switch is connected to the predistorter circuit and the error correction circuit, and the fourth switch is in an off state.

9. The electronic device of claim 8, wherein, in a second phase different from the first phase, the first switch is connected to the input terminal and the ACLR adjustment circuit, and the second switch is connected to the output terminal of the power amplifier and the ACLR adjustment circuit, the third switch is connected to the predistorter circuit and the ACLR adjustment circuit, and the fourth switch is connected to the predistorter circuit and the ACLR adjustment circuit.

10. A method of operation performed by an electronic device, the method comprising:
generating a predistortion signal by predistorting an input signal based on a predistortion coefficient;
generating an output signal by amplifying the predistortion signal;
updating the predistortion coefficient to minimize a Normalized Mean Square Error (NMSE) between the input signal and the output signal; and
based on the NMSE being minimized, calculating an Adjacent Channel Leakage Ratio (ACLR) from the output signal and updating the predistortion coefficient to minimize a cost function based on the ACLR
wherein the cost function is defined as follows:

$$C=\gamma(ACLR_L+ACLR_H)+(1-\gamma)|ACLR_L-ACLR_H,$$
$$|0\leq\gamma\leq1$$

wherein, C is the cost function, $\gamma$ is a weight of the cost function, $ACLR_L$ is a low ACLR corresponding to a low-band adjacent channel based on a target channel of the output signal and $ACLR_H$ is a high ACLR corresponding to a high-band adjacent channel based on the target channel of the output signal.

11. The method of claim 10, further comprising:
modeling a power amplifier model as a function of the predistortion coefficient from the predistortion signal and the output signal.

12. The method of claim 11, wherein based on the NMSE being minimized, an error correction circuit of the electronic device is configured to be deactivated, and an ACLR adjustment circuit is configured to be activated.

13. The method of claim 12, wherein the low ACLR is based on a difference between power of the low-band adjacent channel and power of the target channel, and the high ACLR is based on a difference between power of the high-band adjacent channel and the power of the target channel.

14. The method of claim 12, wherein the updating of the predistortion coefficient to minimize the cost function comprises:
configuring the cost function to minimize a sum of the low ACLR and the high ACLR by setting the weight to be a first value, and
configuring the cost function to minimize a difference between the low ACLR and the high ACLR by setting the weight to be a second value smaller than the first value.

15. The method of claim 10, wherein the updating of the predistortion coefficient to minimize the cost function comprises: based on the predistortion coefficient being updated:
comparing the NMSE corresponding to a time k+1, which is an update time with an NMSE threshold value, k being a natural number, and
comparing a difference value between the predistortion coefficient corresponding to the k+1 time and the predistortion coefficient corresponding to a time k with a coefficient threshold value.

16. The method of claim 15, wherein the updating of the predistortion coefficient to minimize the cost function comprises stopping updating of the predistortion coefficient based on at least one of:
the NMSE corresponding to the k+1 time is less than the NMSE threshold value, and
the difference value is less than the coefficient threshold value is satisfied.

17. An electronic device comprising:
a transceiver; and
a processor connected with the transceiver, and
wherein the processor is configured to:
generate a predistortion signal by predistorting an input signal based on a predistortion coefficient,
update the predistortion coefficient to minimize a Normalized Mean Square Error (NMSE) between the input signal and an output signal of the transceiver; and
based on the NMSE being minimized, calculate an Adjacent Channel Leakage Ratio (ACLR) from the output signal and update the predistortion coefficient to minimize a cost function based on the ACLR,
wherein the cost function is defined as follows:

$$C = \gamma(ACLR_L + ACLR_H) + (1-\gamma)|ACLR_L - ACLR_H|, \quad |0 \leq \gamma \leq 1$$

wherein, C is the cost function, y is a weight of the cost function, $ACLR_L$ is a low ACLR corresponding to a low-band adjacent channel based on a target channel of the output signal and $ACLR_H$ is a high ACLR corresponding to a high-band adjacent channel based on the target channel of the output signal.

18. The electronic device of claim 17, wherein the processor is configured to:
model a power amplifier model as a function of the predistortion coefficient from the predistortion signal and the output signal.

19. The electronic device of claim 17, wherein the processor is further configured to:
the predistortion coefficient being updated, compare the NMSE corresponding to a time k+1, which is an update time with an NMSE threshold value, k being a natural number, and compare a difference value between the predistortion coefficient corresponding to the k+1 time and the predistortion coefficient corresponding to a time k with a coefficient threshold value.

20. The electronic device of claim 19, wherein the processor is configured to:
stop updating of the predistortion coefficient based on at least one of:
the NMSE corresponding to the k+1 time being less than the NMSE threshold value, and
the difference value being less than the coefficient threshold value.

* * * * *